United States Patent
Pollersbeck

[19]

[11] Patent Number: 5,936,439

[45] Date of Patent: Aug. 10, 1999

[54] SWITCHING DEVICE WITH A POWER FET AND AN INDUCTIVE LOAD

[75] Inventor: Werner Pollersbeck, Pförring, Germany

[73] Assignee: Temic Telefunken microelectronic GmbH, Heilbronn, Germany

[21] Appl. No.: 08/855,469

[22] Filed: May 13, 1997

[30] Foreign Application Priority Data

May 14, 1996 [DE] Germany .......................... 196 19 399

[51] Int. Cl.$^6$ .................................................. H03K 17/16
[52] U.S. Cl. .......................... 327/110; 327/427; 327/379
[58] Field of Search .................................... 327/427, 574, 327/581, 110, 379, 380, 381, 308, 309, 310, 313, 314, 327, 328

[56] References Cited

U.S. PATENT DOCUMENTS

| | | | |
|---|---|---|---|
| 4,928,220 | 5/1990 | White | 363/56 |
| 5,157,351 | 10/1992 | Carbolante | 330/277 |
| 5,298,797 | 3/1994 | Redl | 327/387 |
| 5,506,539 | 4/1996 | Kelly et al. | 327/379 |
| 5,663,667 | 9/1997 | Blum et al. | 327/134 |

FOREIGN PATENT DOCUMENTS

| | | |
|---|---|---|
| 3709149 | 9/1987 | Germany . |
| 3730503 | 3/1989 | Germany . |
| 4013997 | 11/1991 | Germany . |
| 4413546 | 10/1995 | Germany . |
| 4428674 | 2/1996 | Germany . |

Primary Examiner—Timothy P. Callahan
Assistant Examiner—Eunja Shin
Attorney, Agent, or Firm—Venable; Norman N. Kunitz

[57] ABSTRACT

A switching device with a power FET for switching an inductive load to which a free-wheeling diode is connected in parallel, wherein the terminal of the series resistor facing away from the gate terminal is connected to a driver circuit which is so designed that it connects the specified terminal with a reverse potential in order to block the FET, wherein, at the beginning of the process of making the FET conductive, it connects the specified terminal with a high resistance to a control voltage source that puts the FET into the conductive state, in such a way that the current rise of the current flowing through the FET is slowed down to such an extent that, within a period of time in which the free-wheeling diode is not yet blocking after starting to make the FET conductive, an increase of the current to undesirable high values is prevented, so that damage to the power FET and the free-wheeling diode and/or other circuit elements and/or the occurrence of electromagnetic disturbances is reduced, and wherein, after the point of time at which the free-wheeling diode has achieved its blocking capability, the specified terminal is connected by the driver circuit with low resistance to a control voltage source which puts the FET into the fully conductive state such that the rate of current rise is increased. Advantages are that electromagnetic disturbances can easily be reduced and that the free-wheeling diode does not have to be selected for short reverse recovery time.

4 Claims, 2 Drawing Sheets

SWITCHING DEVICE WITH A POWER FET AND AN INDUCTIVE LOAD

BACKGROUND OF THE INVENTION

The invention relates to a switching device with a power FET which is provided to switch a current flowing through an inductive load, which is coupled between an operating voltage terminal and the drain terminal of the power FET, and to the gate terminal of which a series resistor is connected whose terminal facing away from the gate terminal can be connected to a control voltage for the power FET, with a free-wheeling diode connected in parallel to the inductive load, and where the parasitic drain source diode included in every FET may also be used for this purpose.

Such arrangements are known and are useful in motor vehicle applications, for instance. It is well known that the free-wheeling diode is employed to protect the FET against a voltage surge that occurs due to the inductance when switching off the power field-effect transistor (FET). If the FET is switched on again after such a short time after having been switched off that injection charges are to be found in the region of the depletion layer of the free-wheeling diode, or in other words if the recovery time has not yet expired, then the free-wheeling diode is not yet capable of blocking when voltage is applied in the reverse direction. In this case, therefore, a very high current flows through the FET for a short period of time that can endanger the FET and the diode and/or other components. It is well known that this problem can be overcome by using a driver circuit that has been specially designed for such cases so that when switching on it slowly takes the FET out of the non-conducting zone into the fully conducting zone. Such state-of-the-art circuits are, however, very elaborate. The very high current flowing through the free-wheeling diode and the FET can also cause electromagnetic disturbances which require elaborate interference suppression measures in order to obtain the necessary electromagnetic compatibility (EMC) characteristics.

A driver circuit for a power FET in an inductively loaded load circuit with a free-wheeling diode is already known from DE-OS 40 13 997 A1 and DE-OS 44 13 546 A1, where a controllable current source enables the voltage to build up accordingly across the free-wheeling diode. Furthermore, means of measuring the voltage in the load circuit are required in accordance with DE-OS 40 13 997 A1, these means being described in DE-OS 44 28 674 as a feedback path. Such circuit arrangements are expensive.

Instead of the special driver circuits mentioned above according to the state of the art, the problem can also or additionally be solved up to a specific slope rate by faster (and hence more expensive) free-wheeling diodes which change particularly quickly from the conductive state to the blocked state.

Furthermore, it should be noted in this context that the FET should produce as little power loss as possible to allow it to be switched as fast as possible from the non-conductive to the conductive state and vice versa. The driver circuit should have as low a resistance as possible and thus the gate terminal should not have too great a series resistance connected to it on the input side. The low-resistance driver results in steep switching signal edges. Especially if the switching device is to be operated with high frequencies (for example, 10 kHz or more), as in the present case, when the FET is to regulate the current through the inductive load by means of pulse width modulation (PWM), it might be necessary to have steeper switching signal edges which in turn introduce problems relating to the above-mentioned reverse recovery time of the free-wheeling diode.

SUMMARY OF THE INVENTION

The object of the invention is to provide a device of the type described at the outset which, at reduced expense, prevents the occurrence of the described high currents that penetrate the free-wheeling diode in the reverse direction and where conventional free-wheeling diodes can be used that do not have to be particularly selected with regard to their off-state interval.

According to the invention the terminal of the series resistor that faces away from the gate terminal is connected to a driver circuit which is so designed that it connects the specified terminal with a reverse potential in order to block the FET, that at the beginning of the process of making the FET conductive it connects the specified terminal with a high resistance to a control voltage source that puts the FET into the conductive state, in such a way that the current rise of the current flowing through the FET is slowed down to such an extent that, within a period of time in which the free-wheeling diode is not yet blocking after starting to make the FET conductive, an increase of the current to undesirable high values is prevented, so that damage to the power FET and/or other circuit elements and/or the occurrence of electromagnetic disturbances is reduced, and that after the point of time at which the free-wheeling diode has achieved its blocking capability the specified terminal is connected by the driver circuit with low resistance to a control voltage source which puts the FET into the fully conductive state such that the rate of current rise is increased and complete switching-through of the FET is assured.

The advantages of the invention are that a series resistor (R1, R2) of sufficient size for reducing electromagnetic disturbances can be used in front of the FET gate, and that the free-wheeling diode does not have to be selected with regard to a particularly short reverse recovery time.

In one embodiment of the invention, provision is made for the terminal of the series resistor facing away from the gate terminal to be connected through another resistor to a voltage source with the required polarity for making the FET conductive, for the junction point of the series resistor and the other resistor to be connected to a control circuit with, these resistors being so designed that when the FET is in the blocking state they connect the junction point to a reverse potential so that the FET is blocked and that at the start of making the FET conductive they isolate the junction point only from the reverse potential in such a way that the current rise of the current flowing through the FET is slowed down by the above-mentioned resistors and that after the point of time at which the free-wheeling diode has achieved its blocking capability, the specified junction point is connected by the control circuit with low resistance to a control voltage source which puts the FET into the fully conductive state.

It is advantageous here that a total of only three different circuit states must be produced in the correct time sequence at the terminal of the series resistor facing away from the gate: starting from a blocking state of the FET, this is then slowly put into the conductive state so that during this time the depletion layer of the free-wheeling diode can become free of charge carriers, a process that is additionally supported by the voltage applied to the free-wheeling diode by the FET after commencement of the conductive state, and then, when the free-wheeling diode has definitely reached its blocking state, a change is made to a low resistance and thus fast through-connection of the FET into the fully conductive state.

Since only an extremely limited number of different d.c. voltages is required (i.e. in the embodiment example the voltages 0V and 5V and the state "not connected"), these can be provided simply and at low cost by a simple binary circuit arrangement, especially with the help of a microprocessor. The switching device is particularly simple when a microprocessor is used the output circuit of which, still a component part of the microprocessor, can be switched to push-pull mode or to open drain by appropriately programming the microprocessor, where in the first above-mentioned case the output terminal of the output circuit of the microprocessor is switched, for example, to 0 V or to 5 V, and in the second above-mentioned case it is switched either to 0 V or to a high-resistance state, i.e. in effect it is not connected. Microprocessors of this kind can be programmed in accordance with the invention in such a way that they modify the configuration of their output circuit in the required sequence as explained in the description of the embodiment example. This change in the output configuration of the microprocessor can be effected by a simple program in the case of conventional microprocessors with configurable output circuit. As the switching frequency grows, however, the load on the microprocessor reaches problematical dimensions and the time it is available for other tasks is reduced accordingly. If suitable registers are provided in addition as compared with conventional microprocessors, the procedure described above could, after initialization, be run automatically and without imposing an additional burden on the microprocessor. The microprocessor would then be available to a greater extent for other tasks.

The application of this principle is also conceivable in a driver IC that switches from "Open Drain" to "Push-Pull" after a fixed or freely settable time, and where the resistors R1 and R2 could be integrated or be replaced by integrated current sources.

BRIEF DESCRIPTION OF THE DRAWINGS

Further features and advantages of the invention are given in the following description of an embodiment example of the invention, with reference to the drawing which shows details relevant to the invention. The various features can be realized here individually or collectively in any combination in an embodiment of the invention. The figures show.

DESCRIPTION OF THE PREFERRED EMBODIMENTS

Figure 1:
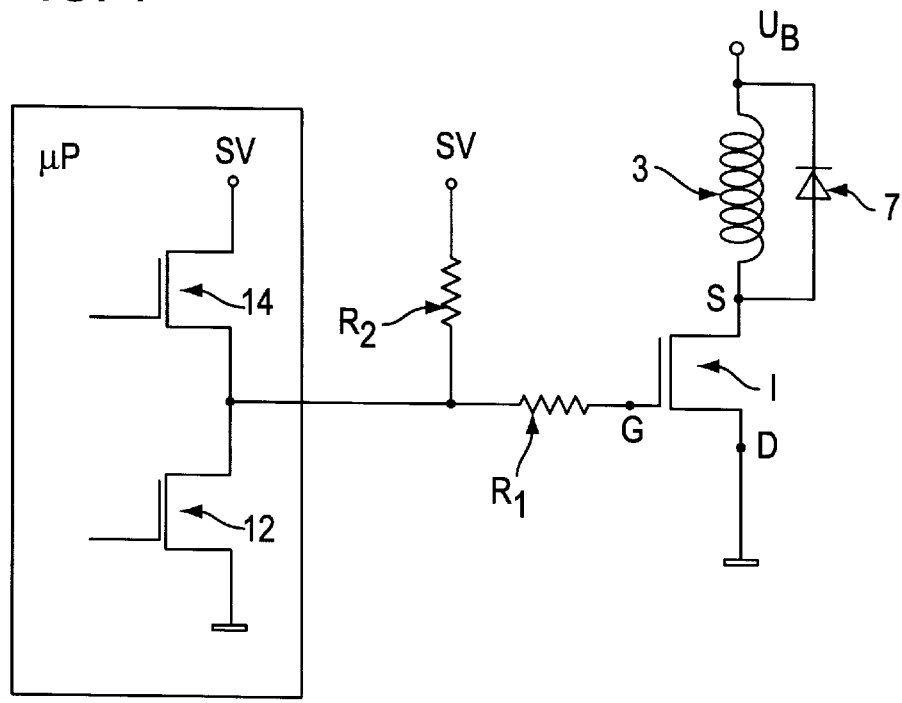
FIG. 1 a circuit diagram of a switching device according to the invention with this switching device being connected to the output circuit of a microprocessor.

In FIG. 1, a power field-effect transistor, referred to below simply as FET 1, is connected through its drain terminal D to ground, its source terminal S is connected through an inductor 3 to the positive pole of a supply voltage source UB, and a series resistor R1 is connected to gate terminal G. The supply voltage source UB is positive with respect to ground; consequently a free-wheeling diode 7 connected in parallel to the inductor 3 is arranged such that its cathode is connected to the terminal of inductor 3 that is connected to the supply voltage source UB. In the embodiment example, inductor 3 is the solenoid of an electromagnetically operated valve.

In the embodiment example, a FET is used whose gate voltage must be 5 V (positive in relation to ground) in order for the FET 1 to switch over to the fully conductive state in which it has only a small resistance for the current flowing through it. If in the circuit described previously a series of pulses were to be supplied at low resistance to the terminal of the series resistor R1 facing away from the gate terminal of the FET 1, and where these pulses alternate between +5 V and 0 V, then, as long as the inductor 3 drives current through the diode 7, and at the time when after being in the blocking state the FET 1 is again put into the conductive state, the free-wheeling diode 7, due to the reverse recovery time, would not have reached its blocking effect with respect to the current flowing from the positive battery voltage source UB to ground so that a very large current, which is effectively a short-circuit current, would flow through the freewheeling diode 7 and the FET 1.

Figure 2A:
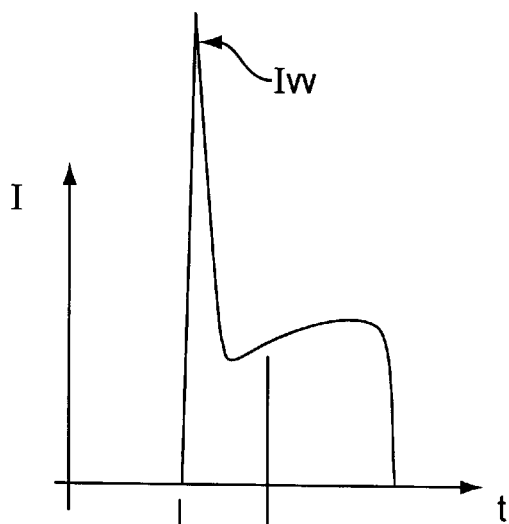
FIG. 2a a time diagram for the current flowing through the FET in a conventional driver circuit.

This is shown in FIG. 2a which displays the current curve as a function of time over the period in which the FET 1 is in the conductive state. As FIG. 2a shows, the current reaches a very high peak, namely the short-circuit current, which is designated Irr.

The circuit arrangement shown in FIG. 1, however, also includes other components. Connected to the terminal of the series resistor R1 facing away from the gate terminal there is a further resistor R2 whose other terminal is connected to a control voltage source of +5 V. Furthermore, the specified terminal of the series resistor R1 is connected to the junction point of two field-effect transistors 12 and 14 that are connected in series, where the FET 14 that is also referred to here as highside FET is connected through its drain terminal to a control voltage source of +5 V and the other FET 12 is connected through its source terminal to ground. The gate terminals of the two FETs 12 and 14 are driven in operation such that in the blocking state of the FET 1 the FET 14 is blocked and the FET 12 is conductive. In this case, the relatively large additional resistor R2 is effectively connected to ground through the FET 12.

Figure 2B:
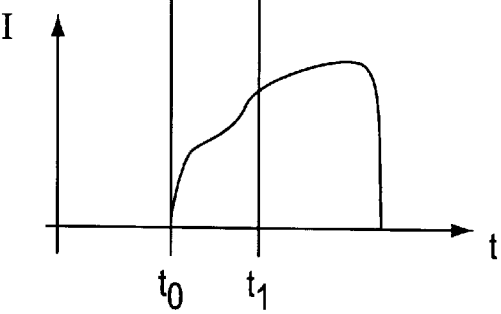
FIG. 2b a time diagram for the current flowing through the FET in a driver circuit according to the invention.

The FET 1 is then blocked. In order to bring the FET 1 relatively slowly into the conductive state, only the FET 12 is then put into the blocked state. The voltage at the gate terminal of the FET 1 then rises at a considerably lower rate on account of the relatively large additional resistor R2 and hence the resistance of the FET 1 diminishes at only a slow rate. If the FET 12 was blocked over a period of time ranging from t0 to t1 in FIGS. 2a and 2b, the current through the FET 1 has assumed a value which, for example, as drawn in FIG. 2b, has reached about half the value of the current flowing through the FET 1 when the FET is fully conductive. During this period from t0 to t1, the free-wheeling diode 7 has definitely re-achieved its blocking capability. Now the highside FET 14 is in the conductive state (whereas the open drain FET 12 is still in the blocked state) and because of the very low internal resistance of the FET 14 the control voltage now rises very quickly at the gate of the FET 1 so that the current through FET 1 very quickly reaches the level shown in FIG. 2b. Consequently, the power loss produced in the FET 1 is on the one hand limited and on the other hand the occurrence of a high short-circuit current at the beginning of the change to the conductive state of the FET 1 is definitely avoided.

The FETs 12 and 14 can be operated by any driver circuit. In the embodiment example, these two FETs are part of a microprocessor and represent its output stage and the FETs 12 and 14 are driven by the microprocessor.

The output stage of the microprocessor is initially configured here as open drain and therefore the power FET 1 is switched on slowly. This results in a flat starting edge, the power FET is initially not fully connected through, the depletion layer of the free-wheeling diode 7 can be cleared of charge carriers without a blocking-state current of short-circuit magnitude occurring. After the time t1, which must be somewhat greater than the reverse recovery time of the freewheeling diode, the output stage is reconfigured to push-pull mode. Now the highside FET of the microprocessor, namely the FET that is not connected to ground, drives the power FET and due to this low-resistance drive the power FET quickly goes into the low-resistance state. Little software effort is required in order to switch over the output stage of the microprocessor.

In the embodiment example, the following circuit components are used and the elements have the following values: The FET 1 is a power FET of type IRLR014, the inductor 3 has an inductance value of 10 mH and an ohmic resistance of 10 ohm, the free-wheeling diode 7 is of type RS2D, the FETs 12 and 14 are the output stage of a microprocessor of type Siemens C167CR. The series resistor R1 has a value of 1 kilo-ohm, the additional resistor R2 has a value of 10 kilo-ohm. The supply voltage UB is provided in the example from a motor vehicle battery and has a level of 12 V, the control voltage supplied to the additional resistor R2 and applied to the source terminal of the highside FET 14 has a level of 5 V. The current shown in FIGS. 2a and 2b was found by measurement in the connecting lead between the drain terminal of the FET 1 and ground.

Figure 3:
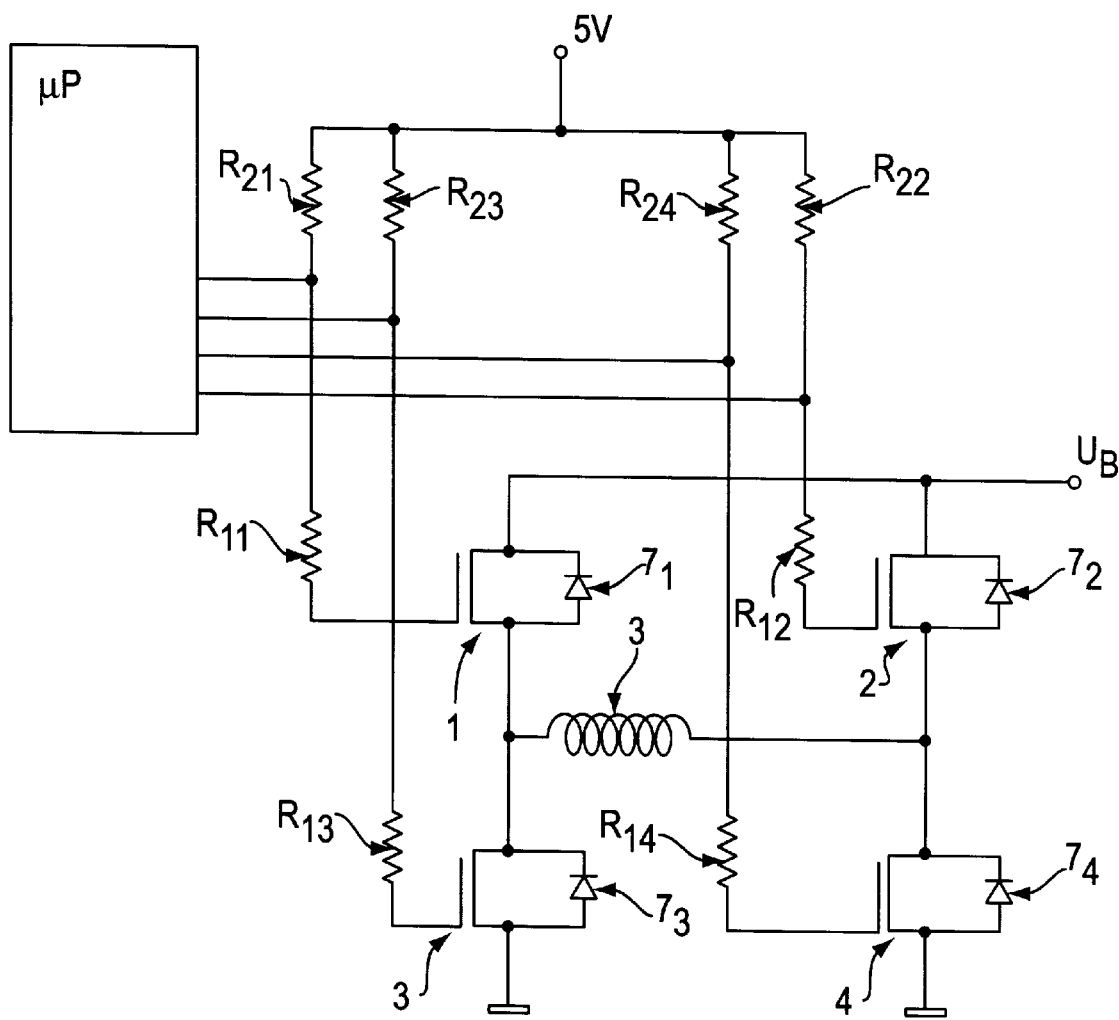
FIG. 3 a circuit diagram of another embodiment example of the invention where the parasitic drain source diodes of the FET are used as free-wheeling diodes.

The circuit diagram shown in FIG. 3 represents a bridge circuit made up of four field-effect transistors 1, 2, 3 and 4 which supplies an inductor 3 as load element with current. Furthermore, the parasitic drain-source diode 71, 72, 73, 74 provided with each FET is shown.

The current flowing through the inductor 3 is to be PWM-controlled and the current direction is to be reversible. A driver circuit μP is provided for this purpose and this is connected through resistors R11, R12, R13 and R14 to the respective gates of FET 1, 2, 3 and 4. As in the circuit shown in FIG. 1, the series resistors R11, R12, R13 and R14 are each connected to a control voltage source of +5 V through an additional resistor R21, R22, R23 and R24 respectively. Each FET is driven in the way described in relation to FIG. 1.

For the one direction of current flow, the driver circuit μP controls the bridge circuit in such a way that the current through the inductor 3 is controlled with FET 2 and FET 3 switched off, FET 1 switched on and FET 4 in PWM mode, the parasitic diode 72 of the FET 2 serving as free-wheeling diode. For the other direction of current flow the FET 1 and FET 4 are switched off whereas the FET 2 is switched on. The parasitic diode 71 of the FET 1 now serves as free-wheeling diode.

The FETs 1, 2, 3, 4, 12 and 14 are controllable electronic switches. The invention also covers embodiments in which other suitable electronic switches are provided in place of the FETs.

What is claimed is:

1. A switching circuit arrangement for controlling a current by switching the current to flow through an inductive load, said circuit arrangement comprising;

an inductive load connected in series with a source-drain current path of a power FET between respective terminals for a source of operating potential;

a freewheeling diode connected in parallel with one of the inductive load and the source-drain current path of the power FET;

a low-impedance first resistor having first and second terminals with the first terminal being connected to the gate terminal of the power FET to supply a control voltage to the power FET;

a high-impedance second resistor connected between the second terminal of the first resistor and a control voltage source providing a potential that places the power FET in the fully conductive state; and, circuit means, connected to the second terminal of the first resistor, for selectively causing a control voltage having one of three states to be applied to the gate terminal of the power FET via the first resistor, with the three states being (1) a blocking potential for blocking the power FET to render it nonconductive, (2) a low voltage potential that places the FET into the conductive state and slows down a rise in the current flowing through the power FET to such a degree that for a specific time interval during which the low voltage potential is applied as the control voltage, the current controlled by the power FET is prevented from rising to undesirably high values so as to prevent damage to the power FET and other connected switching elements, and (3) the higher voltage potential of the control voltage source which causes the power FET to become fully conductive; and wherein the circuit means comprises:

first and second series-connected, electronic switches connected between the control voltage source, which places the FET into the completely conductive state, and the blocking potential, with the first electronic switch being connected to the control voltage source and with the common connection of the series connected electronic switches being connected to the second terminal of the first resistor; and switching control means connected to and controlling the first and second electronic switches for causing:

(a) blocking of the power FET by switching the second electronic switch, which is connected to the blocking potential, to be conductive and the first electronic switch, which is connected to the control voltage source, to be non-conductive; and, (b) the power FET to become fully conductive by initially switching the first and second electronic switches to be non-conductive to slow down the current rise, so that the gate terminal of the power FET is connected via the first and second resistors to the control voltage source, for a time interval greater than the reverse recovery time of the free-wheeling diode, wherein the free-wheeling diode is not yet blocking, and thereafter bridging the high-impedance second resistor by switching the first electronic switch to be conductive and thereby connecting the gate terminal of the power FET via a low-impedance of the first electronic switch and the first resistor to the control voltage source, so that the power FET is fully conductive.

2. A switching circuit arrangement in accordance with claim 1 wherein the electronic switches are parts of a programmable output stage of an integrated circuit.

3. A switching circuit arrangement in accordance with claim 2, wherein a parasitic source-drain diode of the power FET is provided as the free-wheeling diode.

4. A switching circuit arrangement in accordance with claim 1 wherein each of the first and second electronic switches is an FET.

* * * * *